United States Patent
Peuser

(10) Patent No.: US 10,249,435 B2
(45) Date of Patent: Apr. 2, 2019

(54) ELECTRONIC COMPONENT HAVING A CONNECTION ELEMENT

(71) Applicant: Robert Bosch GmbH, Stuttgart (DE)

(72) Inventor: Thomas Peuser, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 99 days.

(21) Appl. No.: 15/518,746

(22) PCT Filed: Aug. 27, 2015

(86) PCT No.: PCT/EP2015/069613
§ 371 (c)(1),
(2) Date: Apr. 12, 2017

(87) PCT Pub. No.: WO2016/058741
PCT Pub. Date: Apr. 21, 2016

(65) Prior Publication Data
US 2017/0236643 A1      Aug. 17, 2017

(30) Foreign Application Priority Data
Oct. 14, 2014    (DE) .................. 10 2014 220 802

(51) Int. Cl.
*H01L 23/495*    (2006.01)
*H01G 4/228*    (2006.01)
(Continued)

(52) U.S. Cl.
CPC .............. *H01G 4/228* (2013.01); *H01G 4/12* (2013.01); *H01G 4/232* (2013.01);
(Continued)

(58) Field of Classification Search
None
See application file for complete search history.

(56) References Cited

U.S. PATENT DOCUMENTS

| 4,158,218 A | 6/1979 | Hucks et al. | |
| 7,436,649 B2 * | 10/2008 | Omura | H01G 2/06 29/25.42 |

(Continued)

FOREIGN PATENT DOCUMENTS

| CN | 1897789 A | 1/2007 |
| DE | 2731998 | 1/1979 |

(Continued)

OTHER PUBLICATIONS

International Search Report for Application No. PCT/EP2015/069613 dated Nov. 12, 2015 (English Translation, 3 pages).

*Primary Examiner* — Chandra Chaudhari
(74) *Attorney, Agent, or Firm* — Michael Best & Friedrich LLP

(57) ABSTRACT

The invention relates to an electronic component. The electronic component 2 has an electrical assembly 3 having two electrical connections 4, 5 that are each formed on opposing faces of the assembly. For each connection 4, 5, the component has at least one electrically conductive connection element 9, 10 having a mounting foot 14, 15 for connection to a circuit carrier 22. According to the invention, the connection element 8, 9 has at least two metal layers 10, 11, 12, 13 at least on one section, wherein the metal layers are each formed from different metals and integrally connected to one another. Preferably, one metal layer 12, 13 from the metal layers has greater thermal conductivity than the other metal layer 10, 11.

11 Claims, 2 Drawing Sheets

(51) Int. Cl.

| | | |
|---|---|---|
| *H05K 1/02* | (2006.01) | |
| *H05K 3/34* | (2006.01) | |
| *H01G 4/232* | (2006.01) | |
| *H01G 4/12* | (2006.01) | |
| *H01G 4/258* | (2006.01) | |
| *H01L 23/373* | (2006.01) | |
| *H01L 23/498* | (2006.01) | |
| *H01L 23/00* | (2006.01) | |
| *H01L 29/861* | (2006.01) | |
| *H05K 1/18* | (2006.01) | |
| *H01G 4/30* | (2006.01) | |

(52) U.S. Cl.
CPC ............ *H01G 4/2325* (2013.01); *H01G 4/258* (2013.01); *H01L 23/3735* (2013.01); *H01L 23/49811* (2013.01); *H01L 24/06* (2013.01); *H01L 29/861* (2013.01); *H05K 1/0203* (2013.01); *H05K 1/181* (2013.01); *H05K 3/3426* (2013.01); *H01G 4/30* (2013.01); *H01L 23/49555* (2013.01); *H01L 23/49582* (2013.01); *H01L 2224/0516* (2013.01); *H01L 2224/05082* (2013.01); *H01L 2224/05124* (2013.01); *H01L 2224/05147* (2013.01); *H01L 2224/05155* (2013.01); *H01L 2224/06181* (2013.01); *H01L 2924/0002* (2013.01); *H05K 2201/10015* (2013.01); *H05K 2201/10174* (2013.01); *H05K 2201/10757* (2013.01); *H05K 2201/10909* (2013.01); *H05K 2201/10946* (2013.01); *Y02P 70/613* (2015.11)

(56) References Cited

U.S. PATENT DOCUMENTS

| | | | |
|---|---|---|---|
| 7,808,770 B2 * | 10/2010 | Itamura | ............ H01G 4/2325 |
| | | | 361/303 |
| 2002/0009610 A1 | 1/2002 | Shimokawa et al. | |
| 2011/0078386 A1 | 3/2011 | Tamura et al. | |

FOREIGN PATENT DOCUMENTS

| | | |
|---|---|---|
| EP | 2131374 | 12/2009 |
| JP | 01289151 | 11/1989 |

* cited by examiner

ELECTRONIC COMPONENT HAVING A CONNECTION ELEMENT

BACKGROUND OF THE INVENTION

The invention relates to an electronic component. The electronic component comprises an electrical structural part having two electrical connections formed respectively on mutually opposite surfaces, in particular end faces, of the structural part. The component has at least one electrically conductive connection element for each connection. The connection element has a securing foot for connection to a circuit carrier, wherein the connection element is cohesively connected to the electrical connection of the component and configured to carry the component.

SUMMARY OF THE INVENTION

According to the invention, the connection element has at least two metal layers at least on a section of the connection element, wherein the metal layers are respectively formed from mutually different metals. The metal layers are cohesively connected to one another, wherein the base layer of the metal layers is connected to the connection and in the region of the securing foot is configured for electrical connection, in particular cohesive connection, in particular soldering connection, sintering connection, or electrically conductive adhesive connection, to a circuit carrier. Preferably, the at least one further metal layer of the metal layers is thermally or additionally electrically connected in parallel with the base layer. Preferably a further metal layer, in particular the metal layer cohesively connected to the base layer, has a greater thermal conductivity than the base layer. In this regard, heat loss generated by the electronic component can advantageously be dissipated via the connection element with improved thermal conductivity, in comparison with a connection element formed only from the base layer. With further advantage, a greater power loss can thus be generated via the same component, compared with a component comprising a connection element consisting of the base layer.

Preferably, the metal layers are cohesively connected to one another at least from the link to the connection of the component through to the securing foot, in particular in an uninterrupted manner. The cohesive connection can be produced for example by plating, in particular roll bonding, electroplating, or cathodic sputtering, or by hard soldering or by laser welding. In this regard, the connection element, and thus also the component, can advantageously be provided in an expedient manner in terms of outlay. In this regard, by way of example, in order to produce the connection element, in particular an angular connection element, a sheet comprising the two metal layers, namely the abovementioned base layer and the further metal layer having a greater thermal conductivity than the base layer, can be produced by the metal layers being connected to one another by means of plating, in particular roll bonding. The sheet formed in a double-layered fashion in this way can then be shaped to form the angled connection element by means of a stamping and/or reshaping process.

Advantageously, in this way, in order to produce the component with a connection element which comprises the electrical structural part, a production process need not be altered in principle.

This is specifically because, advantageously, a connection element formed only from one metal layer can be replaced by a connection element comprising at least two metal layers. A thermally improved component can be formed as a result.

Preferably, for this purpose the connection element has at least two, only two, or three metal layers.

In one preferred embodiment, the base layer is formed by an alloy, comprising iron, and the further layer having the greater thermal conductivity than the base layer is formed by a copper layer.

As a result, the component can advantageously be provided in an expedient manner in terms of outlay. Advantageously, in the case of copper as further layer, a layer thickness of the further metal layer need only be a portion of the layer thickness of the base layer in order thus to produce a significant improvement in the thermal conductivity of the connection element.

Preferably, a layer thickness of the further metal layer directly connected to the base layer is between one tenth and half of the layer thickness of the base layer. By way of example, a layer thickness of the further layer, as copper layer, is one third of the layer thickness of the base layer, in particular of an iron alloy layer. The base layer is formed for example by an alloy, comprising 30 to 45 percent nickel or additionally at least one further alloy constituent, and iron as remaining constituent or main constituent. Advantageously, the base layer composed of such an alloy has a sufficiently good electrical conductivity and a low coefficient of thermal expansion. The coefficient of thermal expansion of such a base layer is preferably less than 10 ppm per kelvin.

In one preferred embodiment, the component is a capacitor, in particular a ceramic capacitor or a film capacitor, for example an SMD film capacitor (SMD=Surface-Mounted Device). In this regard, a power capacitor as component can advantageously be formed which, in comparison with the same power capacitor having a connection element formed from only a base layer, can generate and also dissipate a greater thermal power.

Preferably, the electronic component comprises an electrical structural part, in particular a capacitor, a diode or a resistor having a parallelepipedal shape or cylindrical shape, wherein end faces of the structural part are formed in each case by an electrical connection. As a result, the component can advantageously be soldered to a circuit carrier in a space-saving manner with the connection element.

In one preferred embodiment, the structural part is a resistor or a diode, in particular a semiconductor diode, preferably a power semiconductor diode. The resistor and/or the diode are configured in each case to be soldered, in particular reflow-soldered, selectively soldered, or wave-soldered, to a circuit carrier. For this purpose, the component can be placed by the securing foot onto the circuit carrier and also onto an electrically conductive layer, in particular a conductor track of the circuit carrier, wherein the electrically conductive layer has been printed with a solder paste. In a subsequent step for soldering the component to the circuit carrier the circuit carrier can be soldered together with the component—for example in a reflow soldering furnace.

Preferably, the component is configured for soldering connection, preferably reflow soldering connection, to the circuit carrier. As a result of the good thermal linking to the circuit carrier, the component is cooled well. Advantageously, the component, in particular the abovementioned capacitor, resistor or diode, need not additionally be cooled by a further heat sink, and thus also need not be coupled to a further, separate heat sink, for example an aluminum heat sink having convection fins, in order to be able to pass greater powers via the component and thus also to generate greater power losses in the form of heat loss.

The further metal layer cohesively connected to the base layer is preferably a copper layer, an aluminum layer or a silver layer. The silver layer advantageously has a high thermal conductivity, such that the further metal layer as silver layer can be made thinner, compared with an aluminum or copper layer, in order to pass the same thermal power via the connection element toward the circuit carrier.

In one preferred embodiment of the component, the connection element is an angular element having two limbs integrally formed on one another and extending at a predetermined angle with respect to one another. In this case, one limb of the connection element forms a securing foot, wherein the further limb forms a connection limb, which is connected, in particular connected by soldering, electrically conductively adhesively connected by means of a conductive adhesive, or connected by welding, to the electrical connection. The welding connection is produced by means of resistance welding or laser welding, for example. In this regard, the component can advantageously be provided with a securing foot in an expedient manner in terms of outlay.

In one preferred embodiment, the connection element has a further metal layer, which is formed from the metal of the base layer. The metal layer having the greater thermal conductivity in comparison with the base layer is enclosed—in particular in the manner of a sandwich—between the base layer and the further metal layer composed of the metal of the base layer. Preferably, the further metal layer composed of the metal of the base layer is cohesively connected to the further metal layer having the greater thermal conductivity. In this way, a cohesively connected sandwich composite is formed which can be provided advantageously—for example by means of roll bonding—as raw sheet starting material for producing the connection element in an expedient manner in terms of outlay. The connection element formed in this way advantageously has a smaller warpage transversely with respect to its flat extent in the event of temperature variations, insofar as a bimetal effect produced by mutually different coefficients of thermal expansion of the mutually different metal layers can be compensated for by the further metal layer formed from the metal of the base layer.

In another embodiment, the further metal layer is formed from a different metal than the base layer and has a coefficient of thermal expansion the same as or similar to the coefficient of thermal expansion of the base layer. It is thus advantageously possible to prevent bending of the connection element in the event of temperature variations and thus detachment of the connection element from the connection or from the circuit carrier.

BRIEF DESCRIPTION OF THE DRAWINGS

The invention is described below with reference to figures and further exemplary embodiments. Further advantageous embodiment variants are evident from the features described in the dependent claims and in the figures.

DETAILED DESCRIPTION

Figure 1:
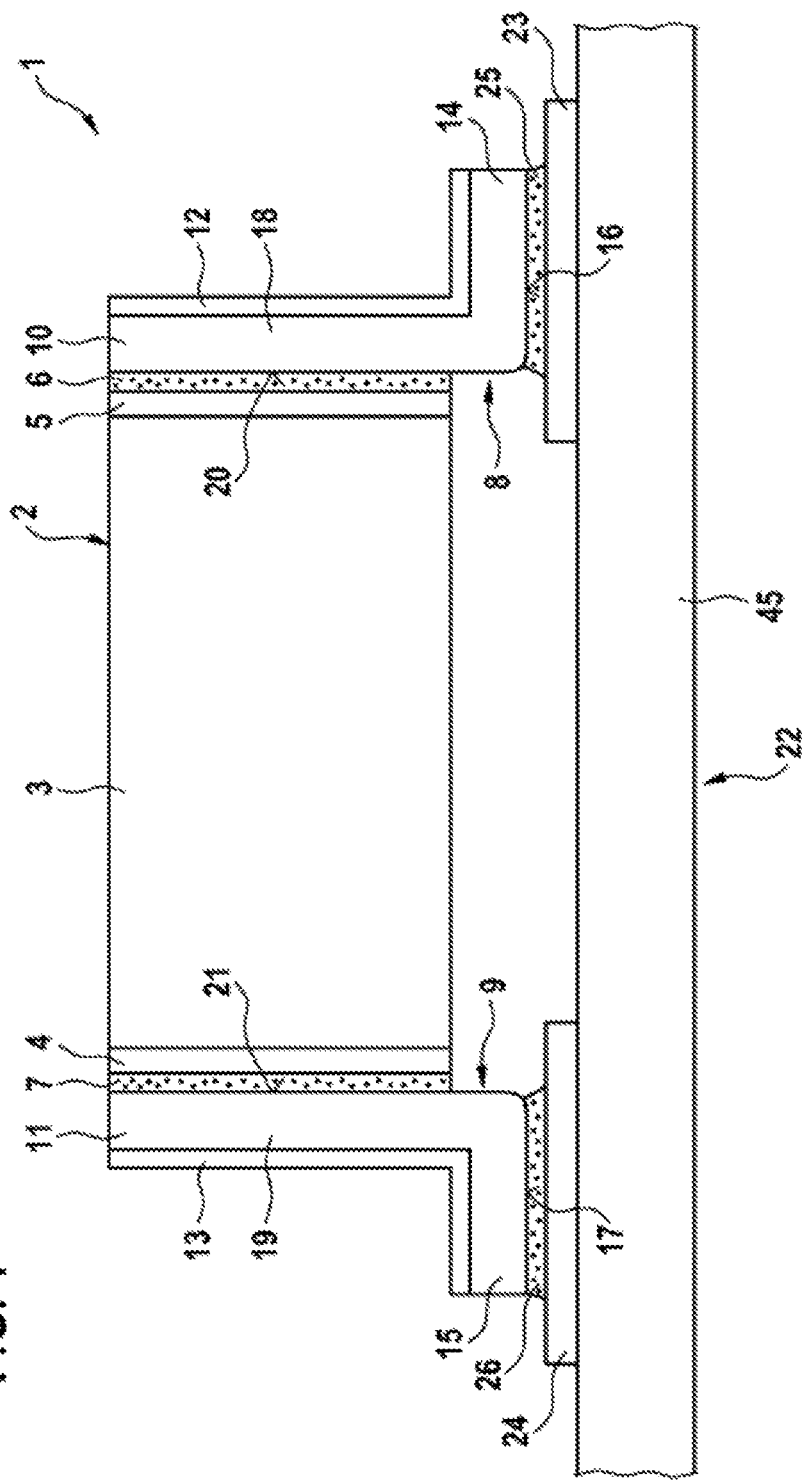
FIG. 1 shows one exemplary embodiment of a connection arrangement comprising a parallelepipedal electronic component comprising electrical connections arranged at mutually opposite end sides, said electrical connections being connected by soldering to a circuit carrier by means of a connection element configured in a double-layered fashion.

FIG. 1 shows—schematically—one exemplary embodiment of a connection arrangement 1. The connection arrangement 1 comprises an electronic component 2. In this exemplary embodiment, the electronic component 2 comprises an electronic structural part 3, in this exemplary embodiment a capacitor, in particular a capacitor configured in a ceramic fashion. The electronic structural part 3 has an electrical connection 4 and an electrical connection 5. The electrical connections 4 and 5 are configured in each case as an electrically conductive layer, which enclose the electronic structural part 3, in this exemplary embodiment the capacitor, between one another and which extend parallel to one another.

The component 2 also comprises a connection element 8, wherein the connection element 8 is formed by an angular element. The connection element 8 has a securing foot 14, which is formed by one limb of the connection element 8 and a further limb 18, wherein the connection limb 18 has a contact area 20, which faces the connection 5, and is cohesively connected by soldering to the connection 5 by means of a solder 6.

That limb of the connection element 8 which forms the securing foot 14 extends at a right angle to the connection limb 18.

In this exemplary embodiment, the connection element 8 has two metal layers, namely a base layer 10 and a further metal layer 12, which respectively lie one on top of the other and are cohesively connected to one another. The cohesive connection between the base layer 10 and the further metal layer 12 is produced by means of roll bonding in this exemplary embodiment.

In this exemplary embodiment, the base layer 10 is formed from an iron-nickel alloy, wherein the nickel proportion is 42 percent. In this exemplary embodiment, the further metal layer 12 is formed by a copper layer. In this exemplary embodiment, a thickness extent of the further metal layer 12 is one third of the thickness extent of the base layer 10.

By way of example, a thickness extent of the base layer 10 is 0.6 millimeter and a thickness extent of the further metal layer 12, in this exemplary embodiment the copper layer, is 0.2 millimeter. In the case of such a layer arrangement of the connection element 8, in comparison with a connection element comprising only the base layer 10, 30% more heat can be dissipated from the component 2 via the connection element 8.

In this exemplary embodiment, the securing foot 14 is connected to an electrically conductive layer 23, in particular a conductor track, of a circuit carrier 22 by means of a solder 25. In this exemplary embodiment, the circuit carrier 22 has an electrically insulating layer 45, in particular a fiber-reinforced epoxy resin layer or a ceramic layer, which is connected to the electrically conductive layer 23 as part of the circuit carrier 22. The circuit carrier 22 also has an electrically conductive layer 24, in particular a conductor track, which is soldered to the securing foot 15 of a connection element 9 by means of a solder 26, and is thus electrically conductively connected to the connection 4 of the component 2. In this exemplary embodiment, the connection element 9 is part of the component 2, wherein the connection element 9 is configured like the connection element 8. For this purpose, the connection element 9 has a connection limb 19, which has a contact area 21, which faces the electrical connection 4, formed by an electrically conductive layer, and is soldered to the electrical connection 4 of the component 2 by means of a solder 7.

A further limb, formed by a securing foot 15, is integrally formed on the connection limb 19. The limb formed by the securing foot 15 and the connection limb 19 extend respectively at a right angle to one another.

The connection element 9 has a metal layer that forms a base layer 11. The base layer 11 corresponds to the base layer 10 of the connection element 8. In this exemplary embodiment, a further metal layer 13, in this exemplary embodiment a copper layer, which is cohesively connected by means of roll bonding is connected to the base layer 11. In this exemplary embodiment, the further metal layer 13 has a thickness extent that is one third of a thickness extent of the base layer 11.

In order to produce the connection arrangement 1, the component 2 can be placed onto the circuit carrier 3, wherein the circuit carrier 3, in particular the electrically conductive layers 23 and 24, can be printed in each case with a solder paste, as solder 25 and 26, respectively.

The component 2 can then be placed onto the circuit carrier 22 for soldering connection to the circuit carrier 22. For this purpose, the securing foot 14 of the connection element 8 can be placed onto the solder 25 by a contact area 16 of the securing foot 14, which forms a standing area in this exemplary embodiment, and the securing foot 15 of the connection element 9 can be placed onto the solder 26 by a contact area 17 forming a standing area of the connection element 9.

In order to solder the component 2 to the circuit carrier 22, the connection arrangement 1 can then be reflow-soldered in a soldering furnace.

Figure 2:
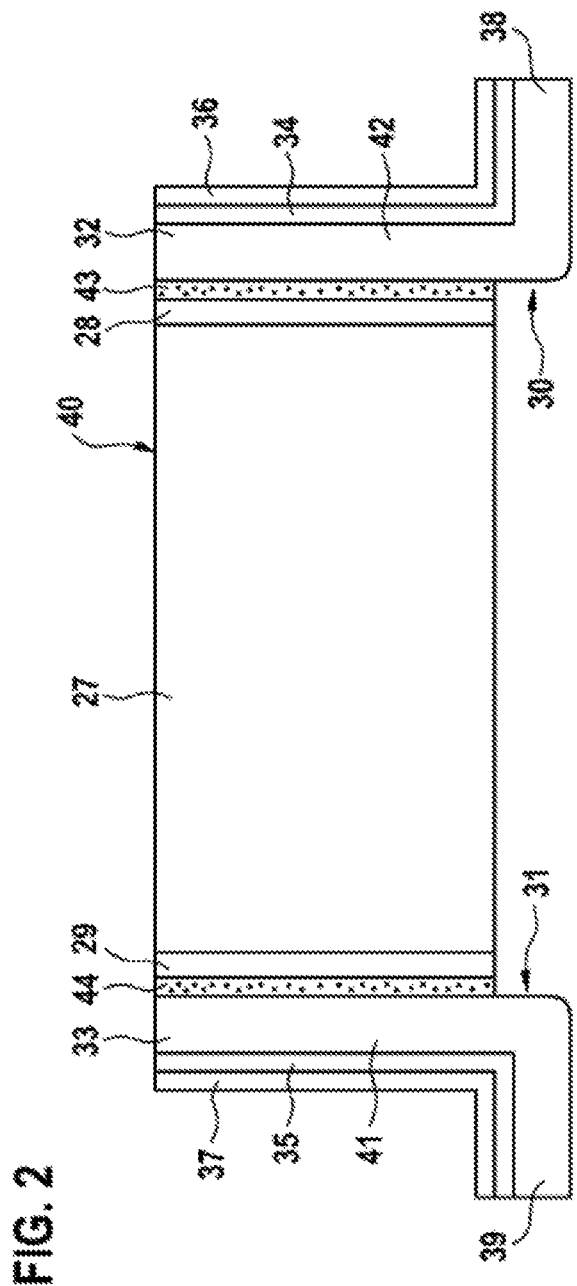
FIG. 2 shows one exemplary embodiment of an electronic component comprising connection elements each having three metal layers.

FIG. 2 shows—schematically—one exemplary embodiment of a component 40. In this exemplary embodiment, the component 40 comprises an electrical structural part 27. The electrical structural part 27 is formed for example by a diode, in particular a semiconductor diode, a capacitor or a resistor.

In another embodiment, the electrical structural part 27 can also be configured as a capacitor, in particular as a ceramic capacitor, or as a resistor. The electrical structural part 27 has an electrical connection 28, and an electrical connection 29. The electrical connection 28 is connected to a connection limb 42 of a connection element 30 by means of a solder 43. The connection element 30 has a securing foot 38 as a further limb, said securing foot being integrally formed on the connection limb 42. In this exemplary embodiment, the securing foot 38 and the connection limb 42 extend at a right angle to one another.

In this exemplary embodiment, the connection element 30 comprises a metal layer 32 as a base layer, which is cohesively connected to a further metal layer 34, which has a greater thermal conductivity than the base layer 32. The further metal layer 34 having the greater electrical conductivity than the base layer 32 is cohesively connected to a further metal layer 36, wherein the further metal layer 36 is formed from the metal of the base layer 32. In this way, too, a bimetal effect that may arise on account of mutual different coefficients of thermal expansion of the base layer 32 and of the further metal layer 34 can advantageously be compensated for.

In this exemplary embodiment, the base layer 32 and the further metal layer 36 are formed from an iron-nickel alloy, wherein a nickel proportion of the alloy is 42%. The further metal layer 34 having a greater thermal conductivity than the metal layers 32 and 36 is formed by a copper layer in this exemplary embodiment. In this exemplary embodiment, a thickness extent of the further metal layer 34 is ⅓ of the thickness extent of the base layer 32. In this exemplary embodiment, a thickness extent of the further metal layer 36 is half of the thickness extent of the base layer 32.

In this exemplary embodiment, the component 40 also comprises a further electrical connection 29, which is connected to a connection limb 41 of a connection element 31 by means of a solder 44. The connection element 31 has a securing foot 39, which forms one limb of the connection element 31. The securing foot 39 and the connection limb 41 of the connection element 31 extend respectively at a right angle to one another.

In this exemplary embodiment, the connection element 31 comprises a metal layer as a base layer 33, which is connected to a further metal layer 35 cohesively, by means of roll bonding in this exemplary embodiment. In this exemplary embodiment, the metal layers 33 and 35 lie directly one on top of the other. In this exemplary embodiment, the further metal layer 35 has a greater thermal conductivity than the base layer 33. In this exemplary embodiment, the further metal layer 35 is cohesively connected to a further metal layer 37. The metal layers 33 and 37 enclose the further metal layer 35—in the manner of a sandwich—between one another.

In the case of the connection element 30, the metal layers 32 and 36 enclose the further metal layer 34—in the manner of a sandwich—between one another. In this exemplary embodiment, the further metal layer 35 is configured as a copper layer. In this exemplary embodiment, the base layer 33 and the further metal layer 37 are formed by an iron alloy, comprising 42 percent nickel.

The connection element 30 can be connected by soldering to the electronic structural part 3, and there to the electrical connection 5, instead of the connection element 8 in FIG. 1. The connection element 31 can be connected by soldering to the electronic structural part 3, and there to the electrical connection 4, instead of the connection element 9 in FIG. 1. The electronic structural part 3 can thus have the connection elements 30 and 31 instead of the connection elements 8 and 9, respectively.

Those limbs of the connection elements 30 and 31 which respectively form a securing foot face away from one another in this exemplary embodiment. In another embodiment, the limbs formed by the securing feet 38 and 39 can face one another. In this embodiment, the securing feet 38 and 39 extend respectively parallel to the electronic structural part 27, such that in the case of a connection arrangement, like the connection arrangement 1, the securing feet 38 and 39 are arranged between the electronic structural part 27 and the circuit carrier 22.

The invention claimed is:

1. An electronic component (2, 40), comprising an electrical structural part (3, 27) having two electrical connections (4, 5, 28, 29) formed respectively on mutually opposite surfaces of the structural part (3, 27), wherein the component (2, 40) has an electrically conductive connection element (8, 9, 30, 31) for each of the connections (4, 5, 28, 29), wherein the connection element has a securing foot (14, 15, 38, 39) for cohesive electrical connection to a circuit carrier (22), wherein the connection element (8, 9, 30, 31) is cohesively connected to the electrical connection (4, 5, 28, 29) and is configured to carry the component (2, 40),
wherein the connection element (8, 9, 30, 31) has at least two metal layers (10, 12, 11, 13, 32, 33, 34, 35, 36, 37)

cohesively connected to one another, respectively formed from mutually different metals, wherein a base layer (10, 11, 32, 33) of the metal layers is connected to the electrical connection (4, 5, 28, 29) and in a region of the securing foot (14, 15, 38, 39) is configured for soldering connection to a circuit carrier (22), such that a further one (12, 13, 34, 35) of the metal layers is thermally connected in parallel with the base layer (10, 11, 32, 33), and wherein the further metal layer (12, 13, 34, 35) has a greater thermal conductivity than the base layer (10, 11, 32, 33), wherein the connection element (8, 9, 30, 31) has a further metal layer (36, 37), which is formed from the metal of the base layer (10, 11, 32, 33), wherein the metal layer having the greater thermal conductivity is enclosed between the base layer (10, 11, 32, 33) and the further metal layer (36, 37) composed of the metal of the base layer (10, 11, 32, 33).

2. The component (2, 40) as claimed in claim 1, characterized in that the metal layers (10, 11, 12, 13, 32, 33, 34, 35, 36, 37) are cohesively connected to one another at least from a link to the connection (4, 5, 28, 29) of the component (2, 40) through to the securing foot (14, 15, 38, 39).

3. The component (2, 40) as claimed in claim 1, characterized in that the base layer (10, 11, 32, 33) is formed by an alloy comprising iron, and the further metal layer (12, 13, 34, 35) having the greater thermal conductivity than the base layer (10, 11, 32, 33) is formed by a copper layer or aluminum layer.

4. The component (2, 40) as claimed in claim 1, characterized in that the base layer (10, 11, 32, 33) comprises between 30 and 45 percent nickel and as further constituent iron.

5. The component (2, 40) as claimed in claim 1, characterized in that a layer thickness of the further metal layer (12, 13, 34, 35) connected to the base layer (10, 11, 32, 33) is between one tenth and half of the layer thickness of the base layer (10, 11, 32, 33).

6. The component (2, 40) as claimed in claim 1, characterized in that the connection element (8, 9, 30, 31) is an angular element having two limbs (14, 18, 15, 19, 38, 39, 41, 42) integrally formed on one another and extending at a predetermined angle with respect to one another, wherein one limb forms the securing foot (14, 15, 38, 39) and the further limb (18, 19, 41, 42) forms a connection limb, which is connected to the electrical connection (4, 5, 28, 29).

7. The component (2, 40) as claimed in claim 1, characterized in that the metal layers (10, 12, 11, 13, 32, 33, 34, 35, 36, 37) cohesively connected to one another are connected to one another by means of roll bonding.

8. The component (2, 40) as claimed in claim 1, characterized in that the structural part (3, 27) is a capacitor.

9. The component (2, 40) as claimed in claim 1, characterized in that the structural part (3, 27) is a semiconductor diode or a resistor.

10. The component (2, 40) as claimed in claim 1, characterized in that wherein the connection element has a securing foot (14, 15, 38, 39) for soldering connection to a circuit carrier (22).

11. The component (2, 40) as claimed in claim 1 wherein the metal layer having the greater thermal conductivity is enclosed in the manner of a sandwich between the base layer (10, 11, 32, 33) and the further metal layer (36, 37).

* * * * *